(12) United States Patent
Dietrich et al.

(10) Patent No.: US 6,647,040 B2
(45) Date of Patent: Nov. 11, 2003

(54) METHOD AND ARRANGEMENT FOR CONTROLLING MODULATED LASERS

(75) Inventors: Werner Dietrich, Vienna (AT); Franz Heiny, Jois (AT)

(73) Assignee: Siemens Aktiengesellschaft, Münich (DE)

( * ) Notice: Subject to any disclaimer, the term of this patent is extended or adjusted under 35 U.S.C. 154(b) by 185 days.

(21) Appl. No.: 09/880,439

(22) Filed: Jun. 13, 2001

(65) Prior Publication Data

US 2002/0003821 A1 Jan. 10, 2002

(30) Foreign Application Priority Data

Jun. 13, 2000 (DE) .......................... 100 29 070

(51) Int. Cl.[7] .............................. H01S 3/00
(52) U.S. Cl. .................. 372/38.01; 372/29.015; 372/32; 372/38.02; 372/38.07
(58) Field of Search ............... 372/29.015, 32, 372/38.01, 38.02, 38.07

(56) References Cited

U.S. PATENT DOCUMENTS

| | | | |
|---|---|---|---|
| 4,464,714 A | * | 8/1984 | Huijser et al. .............. 341/102 |
| 5,283,793 A | | 2/1994 | Shoji |
| 5,517,303 A | * | 5/1996 | Cole et al. ................... 356/479 |
| 5,526,164 A | * | 6/1996 | Link et al. ................... 359/187 |
| 5,777,773 A | | 7/1998 | Epworth et al. |
| 2001/0053009 A1 | * | 12/2001 | Nojima et al. .............. 359/173 |
| 2002/0048063 A1 | * | 4/2002 | Jung et al. ................... 359/124 |

FOREIGN PATENT DOCUMENTS

WO    WO 98/43330    10/1998

* cited by examiner

*Primary Examiner*—Eddie Lee
*Assistant Examiner*—Matthew E. Warren
(74) *Attorney, Agent, or Firm*—Schiff Hardin & Waite

(57) ABSTRACT

A method and an arrangement for controlling modulated lasers are provided, in which an input signal of a laser is modulated by a pilot signal. The combined signal that is emitted is then utilized to control the laser. In order to substantially prevent individual spectral lines of the input signal from affecting the pilot signal, a pilot signal is selected with a frequency spectrum that is spread substantially uniformly in the spectral range of the input signal. Versions of this method are also known by the term "spread spectrum modulation".

14 Claims, 2 Drawing Sheets

METHOD AND ARRANGEMENT FOR CONTROLLING MODULATED LASERS

BACKGROUND OF THE INVENTION

1. Field of the Invention

The invention relates to a method for controlling modulated lasers, in which an input signal of a laser is modulated by a pilot signal and this combined signal is emitted by the laser, in which the light emitted by the laser is received by a receiver element, and in which this received signal is evaluated and utilized to control the laser.

The invention also relates to an arrangement for carrying out this method.

2. Description of the Related Art

Modulated lasers are used, for example, for optical data transmission—both for free-space data transmission and for data transmission using optical fibers. The data is in this case sent, for example, using the time division multiplex method. In this method, a plurality of individual channels are transmitted in different time slots on the same transmission channel.

In all data transmission methods, it is important for the emitted light intensity, which is allocated to a digital value, to be within a predetermined tolerance range. Due to various effects (for example, the operating temperature or the ageing of the components used for the laser), a constant relationship between the input power and the output power cannot be presumed. It is therefore necessary to apply a control method, which changes the operating current of the laser so that the intensity of the output light stays within a defined range.

International patent document WO 98/43330 "Laser Modulation Control Method and Apparatus" dated Mar. 17, 1998 discloses that, for this purpose, a pilot tone is superimposed on the drive signal. In this case, the amplitude of the pilot tone is substantially less than the amplitude of the drive signal. Furthermore, the frequency of the pilot tone is also substantially less than the frequency of the drive signal. The light emitted by the laser is received by a monitor diode, and the signal component caused by the pilot tone is utilized to control the laser power. In this way, the average optical output power of the laser and the amplitude of the output power can be kept constant. Consequently, the intensity of the emitted light, which is allocated to a digital value, is constant.

Since the pilot tone has a comparatively small amplitude in relation to the drive signal, the evaluation can be significantly perturbed if the frequency of the pilot tone coincides with a main spectral line of the frequency spectrum of the drive signal. This problem can be avoided by suitable choice of the frequency of the pilot tone. Such a frequency can generally be determined if the frequency spectrum of the drive signal is known.

However, modern transmission systems are used under a wide variety of constraints. For example, the transmission rate is not predefined, but rather is matched to the current requirements. Furthermore, different data formats are also utilized for optical data transmission. This situation makes it difficult to determine a suitable frequency for the pilot tone, or even make pilot tone determination impossible if information about the drive signal is absent or lacking.

SUMMARY OF THE INVENTION

It is therefore an object of the invention to provide a method and an arrangement which simplify the control of modulated lasers.

This is achieved according to the invention by a method of the type mentioned in the introduction, in which the pilot signal has a frequency spectrum that is spread substantially uniformly at least over a section in the spectral operating range of the laser, especially in the spectral range of the input signal.

By applying such a pilot signal, the problem of effects due to individual spectral lines of the input signal can be substantially avoided in a particularly straightforward way. Only those signal components of the combined signal received by the receiver element which are attributable to the pilot signal then make a substantial contribution to the signal that is utilized to control the laser. To that end, for example, an equivalent measure of the pilot tone amplitude is determined from this signal component. Separation of the input signal and the pilot signal can then be achieved, for example, using correlation techniques. By choosing a suitable pilot signal, the cross correlation between the input signal and the pilot signal should then, in any event, be kept as small as possible. Such a signal sequence could be a pseudonoise sequence.

Such methods, which reduce any mutual influence of the signals by spreading the allocated frequency spectra, are also known by the term "spread spectrum systems".

The amplitude of the pilot signal is ideally substantially less than the amplitude of the input signal. In this way, the optical transmission of the input signal is affected comparatively little by the superimposed pilot signal.

A particularly advantageous configuration of the invention provides a method in which a digital signal sequence is provided for the pilot signal. Such a signal sequence is, for example, a pseudonoise sequence that is chosen so that it has a small cross correlation with the input signal. By using a correlator for demodulation, the problem of effects due to individual spectral lines of the data signal can be substantially avoided. The evaluation in the correlator then involves, in principle, multiplying the signal received by the receiver element and the modulation signal. Only those signal components which are attributable to the pilot signal make a substantial contribution to the signal that is utilized to control the laser.

It is also advantageous if a pulse sequence is provided for the pilot signal. Pulses have a wide frequency spectrum that is spread substantially uniformly, so that they are very suitable for generating a pilot signal.

An advantageous variant of the invention is obtained if the time intervals between the individual pulses are spread pseudorandomly. This virtually precludes any correlation with the input signal. This method is also known by the term "time hopping". In order to obtain the pilot signal from the combined signal received by the receiver element, the time intervals must also be taken into account in the receiver element.

It is particularly advantageous if the pilot signal is generated using feedback shift registers. These represent an established means for producing various digital signal sequences, for example for generating pseudonoise sequences. These sequences are then utilized both to modulate the input signal by the pilot signal and to demodulate the signal received by the receiver element. Apart from this embodiment variant, other methods from spread spectrum technology are also known in principle.

A favorable variant of the invention is obtained if an analog signal, especially an at least piecewise sinusoidal signal, is provided for the pilot signal. In this way, for example, existing circuits can be advantageously reused to generate a pilot tone. According to the prior art, analog signals can also be generated by digital circuits. Thus, a definitive distinction between pure digital technology and analog technology cannot be drawn in this context.

It is also favorable if the frequency of the pilot signal is progressively varied, especially by discontinuous frequency change. Discontinuous frequency changes are also known, for example, by the term "frequency hopping". This frequency variation can be used to obtain a frequency spectrum with arbitrary width. An example of this is a wobble signal, which is a substantially sinusoidal signal whose frequency is varied progressively and constantly. In order to obtain the pilot signal from the combined signal received by the receiver element, the relevant instantaneous frequency of the pilot signal must also be taken into account in the receiver element.

A favorable configuration of the invention is obtained
  if the average output power of the laser is determined from the signal received by the receiver element,
  if the slope of the laser characteristic curve is determined from the signal received by the receiver element, and
  if the laser output power allocated to a digital value is controlled on the basis of the determined average output power of the laser and the slope of the laser characteristic curve.

This control represents a tried and tested method, so that existing circuits can be upgraded in a straightforward manner for the procedure according to the invention.

To carry out the above method, an arrangement is used
  in which a laser is connected to a receiver element via an optical transmission path,
  in which the receiver element is connected to an input of a control unit,
  in which an output of this control unit is connected to the laser, and
  in which there are means for generating a pilot signal and means for modulating the input signal by the pilot signal.

Advantageously, existing arrangements that operate, for example, with sinusoidal pilot tones can be modified fairly easily so that it is possible to apply pilot signals with the properties according to the invention. Neither the laser nor the transmission path or the receiver element require modifications for this purpose. One needs to replace or accordingly modify merely the modules on the transmission side for generating the pilot signal and the modules on the receiver side for processing the received signal. The control algorithm per se, however, can be left unchanged.

An advantageous variant of the invention provides for the use of at least one feedback shift register to generate a pilot signal. These represent an established mechanism for producing various digital signal sequences. If pseudonoise sequences are generated, for example, the length of the shift register used is dictated primarily by the digital sequence to be generated.

It is favorable if the arrangement comprises a mechanism for processing a datastream. It is thus possible, for example, to connect the output of a data processing unit directly to the transmission system. Particularly compact modules can be produced in this way.

A particularly advantageous arrangement is obtained if the arrangement comprises a mechanism for demodulating the signal received by the receiver element. In order to separate the pilot signal contained in the combined signal from the input signal, it is advantageous to use demodulators matched to the relevant modulation technique applied. One example of this is a correlator which multiplies the combined signal by the pilot signal, and hence substantially separates the pilot signal from the input signal.

It is also advantageous if the arrangement comprises a mechanism for filtering the signal received by the receiver element, especially filters with a variable filter characteristic. Using such filters permits matching the filter optimally to the frequency of the transmitted pilot signal. If, for example, a wobble signal, (i.e., a substantially sinusoidal signal whose frequency is varied progressively and constantly) is used for the pilot signal, then the filter frequency can hence be matched according to the instantaneous frequency of the pilot signal.

BRIEF DESCRIPTION OF THE DRAWINGS

The invention is explained in more detail with the aid of an exemplary embodiment, represented in the figures, which relates to an exemplary method and an exemplary arrangement for controlling a modulated laser, a digital pseudonoise sequence being provided for the pilot signal.

DETAILED DESCRIPTION OF THE INVENTION

Figure 1:
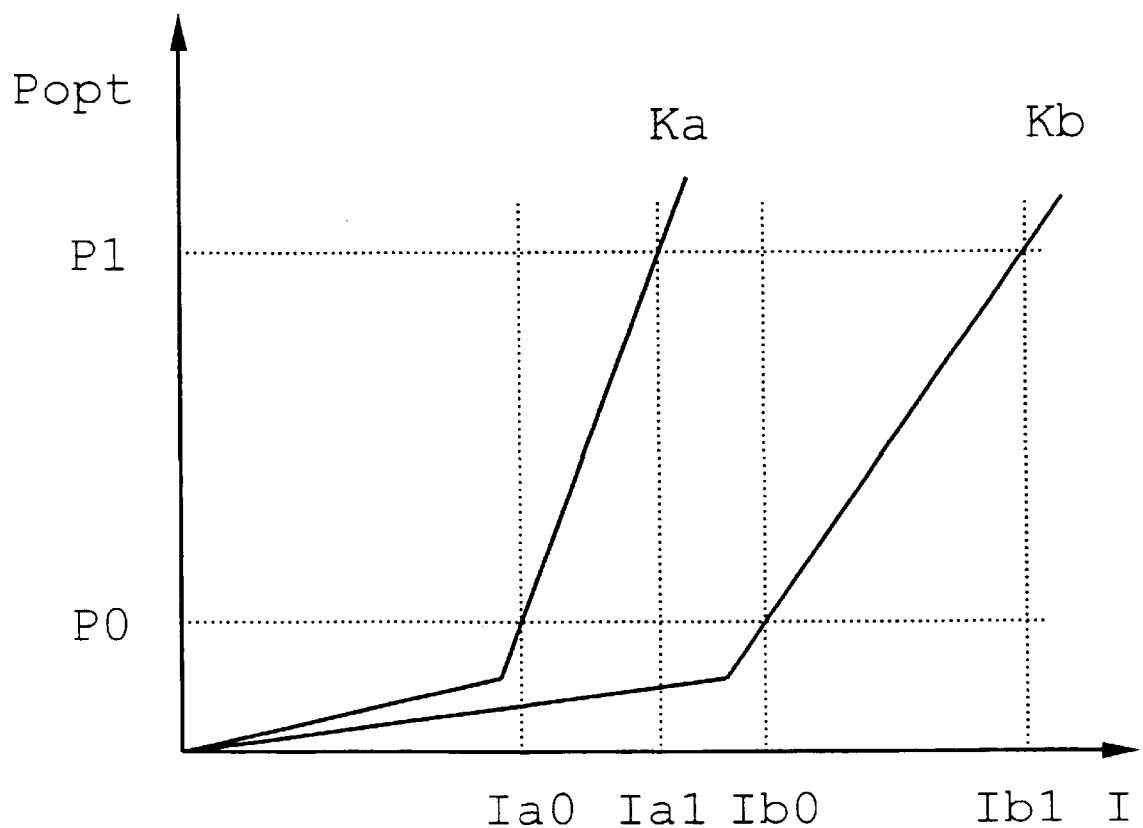
FIG. 1 is a graph showing a power/current diagram of two different laser characteristic curves.

FIG. 1 shows a diagram with a first laser characteristic curve Ka and a second laser characteristic curve Kb, the optical output power Popt being plotted on the vertical axis and the current I supplied to the laser being plotted on the horizontal axis. A first output power P0 shows the optical output power of the laser that is allocated to a digital value 0. A second output power P1 is likewise allocated to a digital value 1. Furthermore, the diagram illustrates a first current Ia0 that shows the current allocated to the first output power P0 on the first laser characteristic curve Ka. A second current Ia1 shows the current allocated to the second output power P1 on the first laser characteristic curve Ka. Likewise, a third current Ib0 is allocated to the first output power P0 on the second laser characteristic curve Kb and a fourth current Ib1 is allocated to the second output power P1 on the second laser characteristic curve Kb.

The first laser characteristic curve Ka and the second laser characteristic curve Kb show the response of the laser in various operating states. The differences in this case are, for example, due to the operating temperature of the laser or in differently aged components of the laser. Both characteristic curves each have a comparatively flat part, in which the light emitted by the laser is incoherent, and a steeper part. In the steeper region of the characteristic curve, the laser is therefore operated with a current that is greater than the threshold current for coherent light. It can be seen from the diagram that the currents which lead to a particular output power of the laser are respectively different on various characteristic curves. Since, however, the first output power P0 and the second output power P1 are to remain constant, the allocated currents need to be adjusted accordingly.

Figure 2:
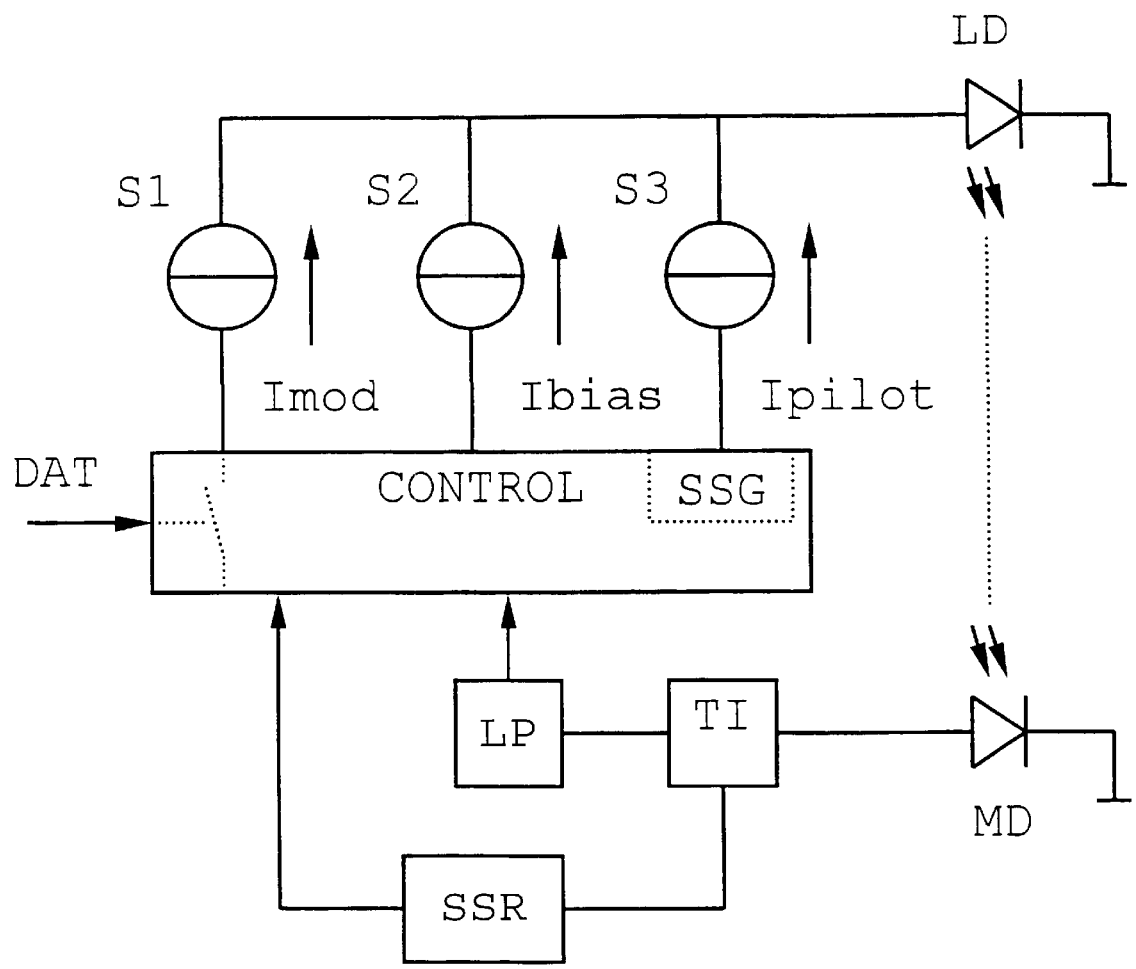
FIG. 2 is a block diagram showing an exemplary arrangement for carrying out the method according to the invention.

FIG. 2 shows an example of an arrangement for carrying out the method according to the invention, in which a control device CONTROL is connected to a first, a second and a third current source S1 . . . S3, and the control device CONTROL also comprises a spread spectrum generator SSG. The first current source S1 delivers a modulation current Imod, the second current source S2 delivers a bias current Ibias and the third current source S3 delivers a pilot current Ipilot. The outputs of the current sources are connected to one another and lead to a laser diode LD, the n-doped side of which is connected to the electrical ground. The laser diode LD is optically connected to a monitor diode MD, the n-doped terminal of which is also connected to the electrical ground. The p-doped side of the monitor diode leads to a transimpedance amplifier TI. A low pass filter LP and a spread spectrum receiver SSR are connected to the transimpedance amplifier TI, the output signals being respectively used as an input signal for the control device CONTROL. The control device CONTROL also has a data input DAT. The data input DAT is connected, in the control device CONTROL, to the control for the first current source Si. This connection is symbolized by a switch.

The arrangement shown in FIG. 2 functions as follows:

The laser diode LD is driven by the first current source S1, the second current source S2 and the third current source S3, the modulation current Imod, the bias current Ibias and the pilot current Ipilot being superimposed. All three current sources S1 through S3 are driven by the control device CONTROL substantially so as to provide a direct current for the bias current Ibias, a square wave current for the modulation current Imod and, for example, a square wave current corresponding to a pseudonoise sequence for the pilot current Ipilot. To drive the third current source S3, a spread spectrum generator SSG is also provided in the control device CONTROL.

The bias current Ibias is chosen so that it is greater than the threshold current for coherent light and leads to the first output power P0. This current is constant, so that the laser diode LD always delivers at least the first output power P0. The modulation current Imod, in combination with the bias current Ibias, leads to the second output power P1 and is clocked by the control device CONTROL in accordance with the datastream present at the data input DAT. In this way, a binary input pattern is mapped onto a light sequence, the first output power P0 being allocated to a binary zero, and the second output power P1 being allocated to a binary 1. The pilot current Ipilot is chosen so that its amplitude is substantially less than the modulation current Imod. The frequency spectrum of the pilot current Ipilot here comprises a range which is as large as possible, so that any correlation with a discrete frequency value of the drive signal turns out to be small.

The light emitted by the laser diode LD is received by a monitor diode MD and converted into a current.

This current is amplified by the transimpedance amplifier TI and is converted into a voltage, which is respectively fed to the low pass filter LP and to the spread spectrum receiver SSR. The low pass filter LP produces a DC voltage from the supplied current, proportional to the average laser output power, which is used by the control device CONTROL as a first control parameter. The second control parameter is formed by the spread spectrum receiver SSR, which delivers a DC voltage that is proportional to the amplitude of the fluctuation in the laser output power caused by the pilot current Ipilot.

The evaluation in the spread spectrum receiver SSR is then carried out substantially by multiplying a signal, proportional to the pilot current Ipilot, by the output signal of the transimpedance amplifier TI, which is proportional to the current through the monitor diode MD. As a result of this multiplication, only signal components that correlate with the pilot current Ipilot make a substantial contribution to the DC voltage at the output of the spread spectrum receiver SSR.

If this DC voltage is divided by the amplitude of the pilot current Ipilot, a parameter is obtained which, independently of the actual level of the pilot current, is proportional to the gradient of the laser characteristic curve. Since the first control parameter is hence proportional to the average laser output power, and the second control parameter is proportional to the gradient of the laser characteristic curve, the required values for the currents can be set using the control device CONTROL. The proportionality constants needed for this are then obtained from the circuit layout.

The signal for the spread spectrum generator SSG and for the spread spectrum receiver SSR can, for example, be obtained in a straightforward way from a feedback shift register. Many other methods are, however, known for performing this function. In this context, see also Robert C. Dixon, "Spread Spectrum Systems", John Willy & Sons, ISBN 0-471-88309-3.

The modular structure of the arrangement is not compulsory. Rather, it is also conceivable for a plurality of modules to be combined into one. An example of this might be to integrate the transimpedance amplifier TI, the low pass filter LP and the spread spectrum receiver SSR in the control device CONTROL. On the other hand, for example, it is also possible to use a separate spread spectrum generator SSG instead of the one integrated in the control device CONTROL. Similar considerations apply to the clock generator for the modulation current Imod.

The above-described method and apparatus are illustrative of the principles of the present invention. Numerous modifications and adaptations will be readily apparent to those skilled in this art without departing from the spirit and scope of the present invention.

What is claimed is:

1. A method for controlling modulated lasers, comprising the steps of:
    spreading a frequency spectrum of a pilot signal substantially uniformly at least over a section in a spectral operating range of a laser including a spectral range of an input signal;
    modulating the input signal of the laser by the pilot signal and emitting this combined signal by the laser;
    receiving the light emitted by the laser by a receiver element, thus producing a received signal; and
    evaluating and utilizing the received signal to control the laser.

2. The method as claimed in claim 1, wherein an amplitude of the pilot signal is substantially less than an amplitude of the input signal.

3. The method as claimed in claim 1, further comprising the step of providing a digital signal sequence for the pilot signal.

4. The method as claimed in claim 1, further comprising the step of providing a pulse sequence for the pilot signal.

5. The method as claimed in claim 4, further comprising the step of spreading pseudorandomly time intervals between individual pulses.

6. The method as claimed in claim 1, further comprising the step of generating the pilot signal using feedback shift registers.

7. The method as claimed in claim 1, further comprising the step of providing an analog signal, including an at least piecewise sinusoidal signal, for the pilot signal.

8. The method as claimed in claim 7, further comprising the step of progressively varying the frequency of the pilot signal, including by discontinuous frequency change.

9. The method as claimed in claim 1, further comprising the steps of:

determining an average output power of the laser from the signal received by the receiver element, determining a slope of a laser characteristic curve is determined from the signal received by the receiver element; and controlling laser output power allocated to a digital value based on a determined average output power of the laser and the slope of the laser characteristic curve.

10. An arrangement for controlling modulated lasers, comprising:

a laser;

a receiver element connected to the laser via an optical transmission path for receiving a received signal;

a control unit having an input to receive an input signal to which the receiver element is connected, the control unit having an output that is connected to the laser;

a pilot signal generator for generating a pilot signal; and a modulator for modulating the input signal by the pilot signal;

the arrangement being utilized for:

spreading a frequency spectrum of the pilot signal substantially uniformly at least over a section in a spectral operating range of the laser including a spectral range of the input signal;

modulating an input signal of the laser by the pilot signal and emitting this combined signal by the laser;

receiving the light emitted by the laser by the receiver element, thus producing the received signal; and evaluating and utilizing the received signal to control the laser.

11. The arrangement as claimed in claim 10, further comprising at least one feedback shift register for generating the pilot signal.

12. The arrangement as claimed in claim 10, further comprising a datastream processor.

13. The arrangement as claimed in claim 10, further comprising a demodulator for demodulating the received signal received by the receiver element.

14. The arrangement as claimed in claim 10, further comprising a filter for filtering the signal received by the receiver element, the filter having variable filter characteristics.

* * * * *